United States Patent [19]

Hoke et al.

[11] Patent Number: 4,568,397

[45] Date of Patent: Feb. 4, 1986

[54] METALORGANIC VAPOR PHASE EPITAXIAL GROWTH OF GROUP II-VI SEMICONDUCTOR MATERIALS

[75] Inventors: William E. Hoke, Wayland; Richard Traczewski, Milton; Peter J. Lemonias, Watertown, all of Mass.

[73] Assignee: Raytheon Company, Lexington, Mass.

[21] Appl. No.: 649,650

[22] Filed: Sep. 12, 1984

[51] Int. Cl.$^4$ .................... H01L 21/365; H01L 31/00
[52] U.S. Cl. .................. 148/175; 29/576 E; 29/572; 148/DIG. 63; 148/DIG. 64; 148/DIG. 80; 148/DIG. 110; 156/610; 156/613; 156/614; 156/DIG. 72; 156/DIG. 82
[58] Field of Search ....... 148/175, DIG. 63, DIG. 64, 148/DIG. 80, DIG. 110; 29/576 E, 572; 156/610, 613, 614, DIG. 72, DIG. 82

[56] References Cited

U.S. PATENT DOCUMENTS 3,218,203  11/1965  Ruehrwein ................... 148/175
3,619,282  11/1971  Manley et al. .............. 156/610 X
4,439,267  3/1984   Jackson ...................... 156/614

OTHER PUBLICATIONS

"High Quality $Hg_{1-x}Cd_xTe$ Epitaxial Layers by the Organometallic Process" by S. K. Ghandhi et al., Applied Physics Letter, vol. 44, No. 9, (Apr. 1984), pp. 779-781.

"Low Temperature CVD Growth of Epitaxial HgTe on CdTe" by T. F. Kuech, Solid-State Science and Technology, vol. 128, No. 5, (May 1981), pp. 1142-1144.

"The Growth of $Cd_xHg_{1-x}Te$ Using Organometallics" by J. B. Mullin et al., J. Vac. Sci. Technol., 21(1), May/Jun. 1982, pp. 178-181.

"Metal-Organic Vapor Deposition of CdTe and HgCdTe Films" by W. E. Hoke et al., Journal of Applied Physics, vol. 54, No. 9 (Sep. 1983), pp. 5087-5089.

"The Use of Metal-Organics in the Preparation of Semiconductor Materials" by H. M. Manasevit et al., Solid State Science, (Apr. 1971), vol. 118, No. 4, pp. 644-647.

"Vapour Phase Epitaxy of $Cd_xHg_{1-x}Te$ Using Organometallics" by J. B. Mullin et al., J. Phys. D: Appl. Phys., 14 (1981), pp. L149-L151.

"Growth by MOVPE and Characterisation of $Cd_xHg_{1-x}Te$" by S. J. C. Irvine et al., Journal of Crystal Growth, (1981), pp. 107-115.

"Organometallic Growth of II-VI Compounds" by J. B. Mullin et al., Journal of Crystal Growth, (1981), pp. 92-106.

Primary Examiner—William G. Saba
Attorney, Agent, or Firm—Denis G. Maloney; Richard M. Sharkansky

[57] ABSTRACT

A method for growing a Group II-VI epitaxial layer on a substrate, said epitaxial layer having an electron mobility greater than $1.5 \times 10^5$ cm$^2$/V-sec at 77° K. and a carrier concentration less than $4 \times 10^{15}$ (cm$^{-3}$) is described. The method includes the steps of directing a plurality of vapor flows towards the substrate including a Group II metalorganic vapor having a mole fraction in the range of $3.0 \times 10^{-4}$ to $4.5 \times 10^{-4}$, a Group VI metalorganic vapor having a mole fraction in the range of $2.9 \times 10^{-3}$ to $3.5 \times 10^{-3}$ and a Group II elemental metal vapor having a mole fraction in the range of $2.6 \times 10^{-2}$ to $3.2 \times 10^{-2}$. The source of Group II metal is heated to at least 240° C. while radiant energy is directed toward the reactor vessel to warm the zone of the reactor vessel between the Group II metal source and the substrate to at least 240° C. The directed flows of Group II metalorganic vapor, Group VI metalorganic vapor and Group II metal vapor then chemically react to form the epitaxial layer.

6 Claims, 4 Drawing Figures

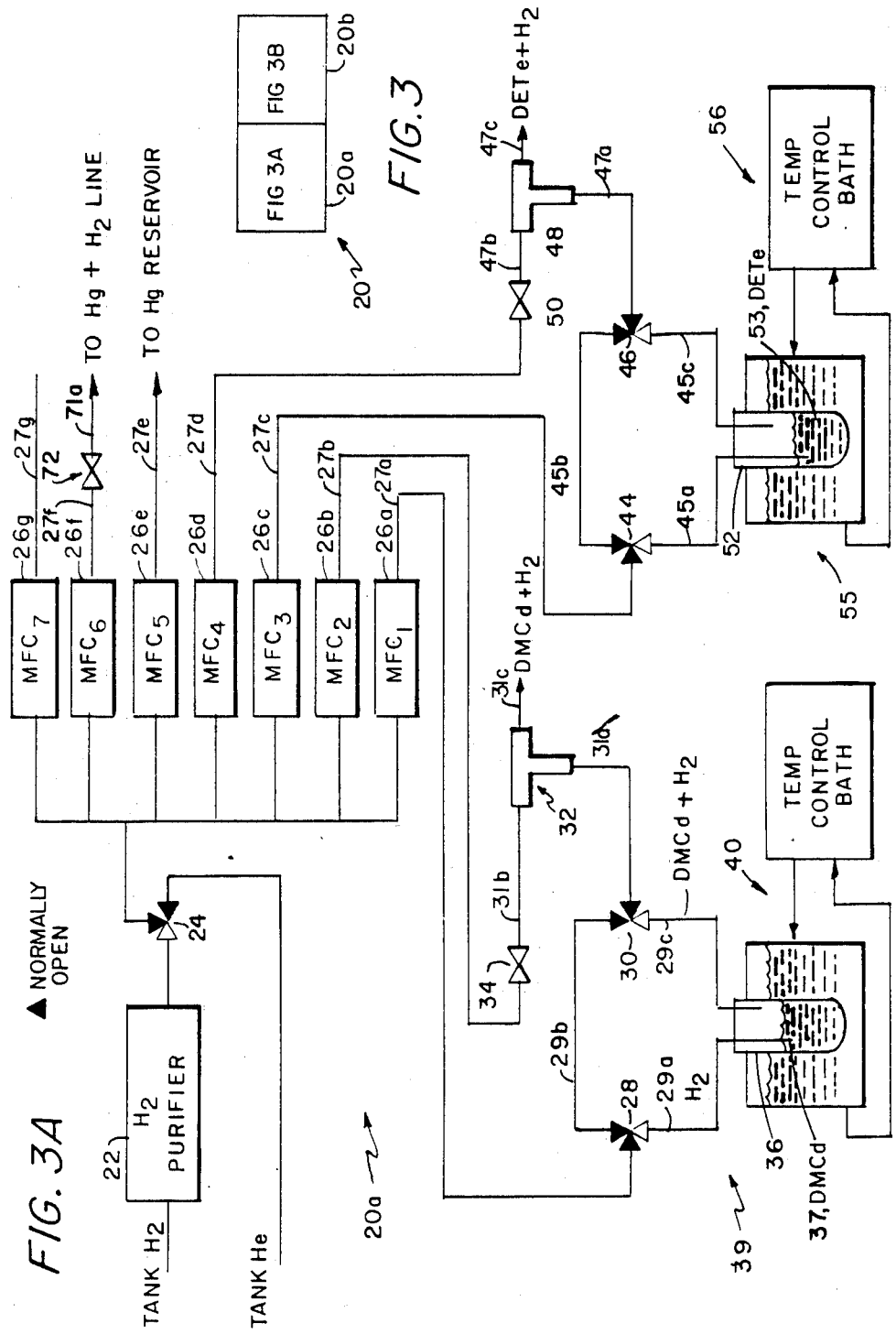

METALORGANIC VAPOR PHASE EPITAXIAL GROWTH OF GROUP II-VI SEMICONDUCTOR MATERIALS

BACKGROUND OF THE INVENTION

This invention relates generally to epitaxial growth techniques, and more particularly, to epitaxial growth of Group II-VI semiconductor materials.

As is known in the art, Group II-VI semiconductor epitaxial materials, such as cadmium telluride and mercury cadmium telluride have important applications as photodetector elements for detection of electromagnetic energy in the spectral range from approximately 0.8 $\mu$m to 30 $\mu$m. By adjusting the alloy composition, photodetector elements comprised of mercury cadmium telluride may be fabricated to cover certain wavelength ranges within the 0.8 $\mu$m to 30 $\mu$m band. That is, for short wavelength applications, i.e., those wavelengths close to 0.8 $\mu$m, cadmium telluride (CdTe) is generally used. For longer wavelengths greater than approximately 0.8 $\mu$m, mercury cadmium telluride ($Hg_{1-x}Cd_xTe$) is used where x is the composition ratio of cadmium to tellurium. Therefore, by adjusting the alloy composition, an epitaxial material is provided to cover portions of the entire spectral range of 0.8 $\mu$m to over 30 $\mu$m. That is, photodetector elements may be fabricated to be responsive to particular wavelength bands of infrared electromagnetic energy.

Several different epitaxial growth techniques have been suggested for providing epitaxial layers of cadmium telluride and mercury cadmium telluride suitable for use in photodetector applications.

One method suggested in the art for fabricating epitaxial layers of Group II-VI materials is growing such layers by liquid phase epitaxy (LPE). However, it has been found that growing such epitaxial layers with LPE growth techniques has several problems. In the LPE growth process, the substrate is brought into direct contact with a growth melt of the material which is to be epitaxially grown thereon. As a consequence of this contacting, the surface morphology of the substrate as well as the grown epitaxial layers is degraded due to back-etching (i.e., partial dissolving) of the substrate by the melt, so-called dendritic growth (formation of small crystallites which adhere to the epitaxial layer surface) and incomplete melt removal after growth. A second problem with LPE, due to the substrate melt contact, is that the substrate must be chemically similar to the melt, otherwise, the substrate may be dissolved by the melt or, alternatively, the melt may not wet the substrate thereby inhibiting the growth of an epitaxial film. This problem prevents the use of the LPE techniques for growing epitaxial layers of Group II-VI material on foreign or different, chemically dissimilar substrate materials. A further problem with the LPE technique is that in order to provide epitaxial growth of HgCdTe films, the substrate temperature must be approximately 500° C. At this substrate temperature interfaces, or the interdiffusion of cadmium and mercury, between the substrate and the epitaxial layer increase, providing material having a nonuniform composition and hence incorrect infrared detection characteristics. A further problem with this technique is that the resulting material has a high concentration of electrically active impurities as well as native crystal defects which are difficult to control, therefore providing crystals having unpredictable electrical properties. Thus, prior to any device fabrication, the substrate and epitaxial layer are generally annealed.

A second method suggested to overcome some of the problems associated with liquid phase epitaxial growth is the so-called metalorganic vapor phase epitaxy (MOVPE), also referred to as metalorganic chemical vapor phase deposition (MOCVD) technique. The MOCVD technique involves directing vapors of alkyls of Group II and Group VI elements into a reactor vessel and chemically reacting the metalorganics to provide the epitaxial Group II-VI material. As described in an article entitled "The Growth of $Cd_xHg_{1-x}Te$ Using Organometallics" by J. B. Mullin et al, Journal of Vacuum Science Technology, Volume 21, No. 1, May-June 1982, and as described in an article entitled "Vapor Phase Epitaxy of $CdHg_{1-x}Te$ Using Organometallics" by J. B. Mullin et al, Journal of Applied Physics, Volume 14, 1981, pps. L149-151, while heretofore epitaxial growth of mercury cadmium telluride epitaxial films has been demonstrated, as indicated in these articles, the quality of the epitaxial films grown are not suitable for use in the photodetector applications. Such materials are not suitable because they have relatively high carrier concentrations and the electron mobilities of the material are relatively low. These two properties are important in photoconductive detector elements, because such elements act as infrared sensitive resistors having a conductivity between a pair of contacts thereof which changes in response to incident infrared energy. If the carrier concentration is too high, or the electron mobility is too low, carriers generated in response to the incident infrared radiation will recombine without the conductivity of the device changing between the terminals.

SUMMARY OF THE INVENTION

In accordance with the present invention, a method for growing a Group II-VI epitaxial layer on a substrate, said epitaxial layer having an electron mobility greater than $1.5 \times 10^5$ cm$^2$/V-sec at 77° K and a carrier concentration less than $4 \times 10^{15}$(cm$^{-3}$) includes the steps of directing a plurality of vapor flows towards the substrate including a Group II metalorganic vapor having a mole fraction in the range of $3.0 \times 10^{-4}$ to $4.5 \times 10^{-4}$, a Group VI metalorganic vapor having a mole fraction in the range of $2.9 \times 10^{-3}$ to $3.5 \times 10^{-3}$ and a Group II elemental metal vapor having a mole fraction in the range of $2.6 \times 10^{-2}$ to $3.2 \times 10^{-2}$. The source of Group II metal is heated to at least 240° C. while radiant energy is directed toward the reactor vessel to warm the zone of the reactor vessel between the Group II metal source and the substrate to at least 240° C. The directed flows of Group II metalorganic vapor, Group VI metalorganic vapor and Group II metal vapor then chemically react to form the epitaxial layer. With this arrangement, by providing the flows in the ranges specified, and warming the reactor vessel in the zone between the Group II metal source and in the substrate, Group II-VI epitaxial layers are provided having a high crystalline quality and electron mobilities greater than $1.5 \times 10^5$ cm$^2$/V-sec at 77° K and carrier concentrations less than $4 \times 10^{15}$ cm$^{-3}$.

In accordance with an additional aspect of the present invention, the metalorganic sources are diethyltelluride, dimethylcadmium and the metal source is elemental mercury. The dimethylcadmium vapor has a mole fraction of $3 \times 10^{-4}$, diethyltelluride vapor has a mole fraction of $3 \times 10^{-3}$, and the mercury vapor has a mole fraction of $3 \times 10^{-2}$. The source of mercury and reaction zone adjacent the source and substrate are heated to 244° C. The flows of diethyltelluride, dimethylcadmium and mercury are directed to a CdTe substrate which is at a temperature in the range of 400°–410° C. With this arrangement, epitaxial layers of mercury cadmium telluride (HgCdTe) are grown on the substrate having relatively low carrier concentrations and relatively high electron mobility.

BRIEF DESCRIPTION OF THE DRAWINGS

The foregoing features of this invention, as well as the invention itself, may be more fully understood from the following detailed description of the drawings, in which:

FIGS. 3A, 3B are schematic diagrams of a growth apparatus for use in growing the epitaxial layer shown in FIG. 1.

DESCRIPTION OF THE PREFERRED EMBODIMENT

Figure 1:
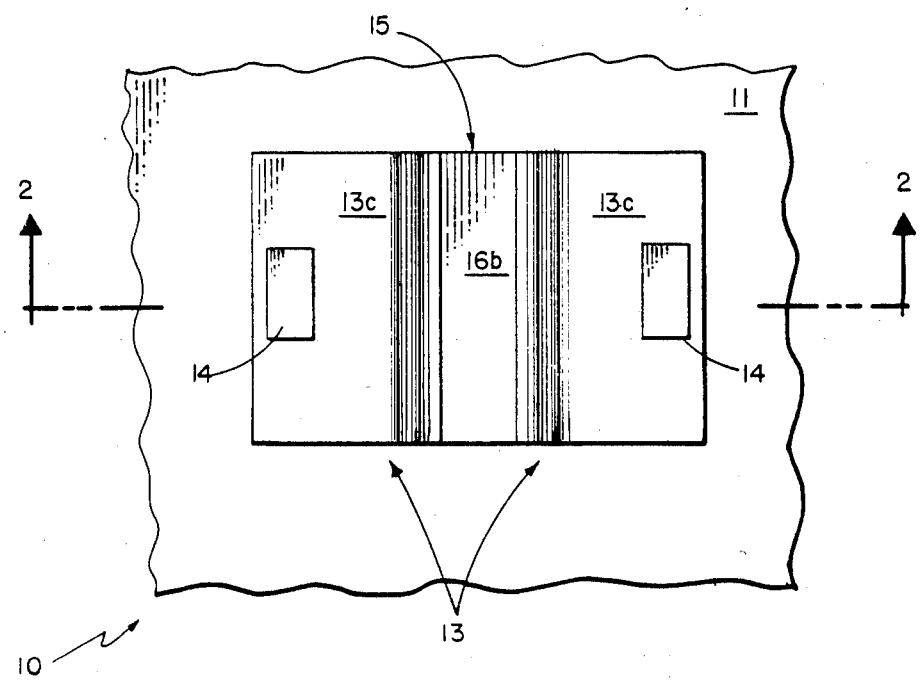
FIG. 1 is a plan view of a photodetector element, here a photoconductive element including epitaxial layers of Group II–Group VI semiconductor materials.
Figure 2:
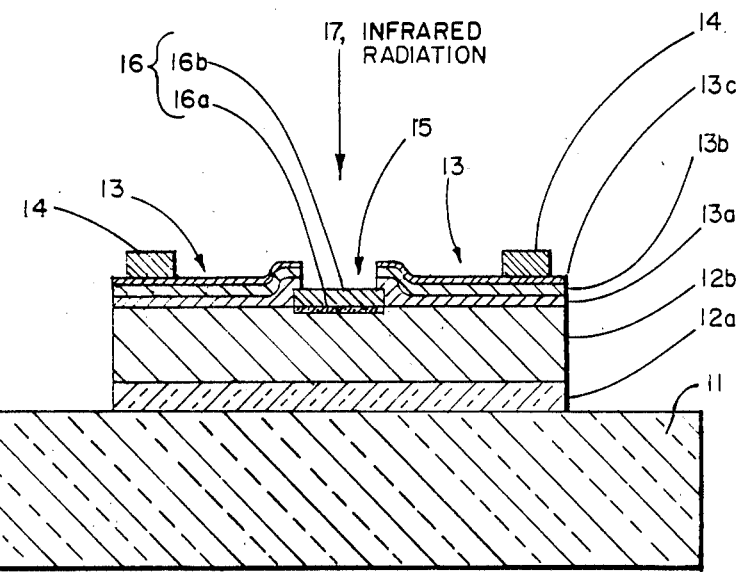
FIG. 2 is a cross-sectional view taken along line 2—2 of FIG. 1.

Referring now to FIGS. 1 and 2, a typical photoconductive element 10, suitable for use in a photoconductive array (not shown), is shown to include a substrate 11, here of cadmium telluride (CdTe), or gallium arsenide (GaAs), indium antimonide (InSb) or other suitable Group II-VI or Group III-V substrate material. Disposed on substrate 11 is a Group II-VI epitaxial buffer layer 12a, here of cadmium telluride (CdTe) and an epitaxial layer 12b of cadmium telluride or mercury cadmium telluride (HgCdTe). Disposed on portions of the epitaxial layer 12b are a pair of electrical ohmic type contacts 13, each provided from a patterned composite layer comprising sequentially deposited layers 13a, 13b and 13c, respectively, of Indium (In), 10,000 Å thick, Chromium (Cr), 500 Å, and gold (Au), 5000 Å thick. Gold pads 14, each 1.5 μm thick, are disposed over the contacts 13 to provide a bonding point to external components.

Disposed in a channel region 15 between the ohmic contacts 13 is as passivation layer 16a, here of an anodic oxide of HgCdTe layer 12b as is known, 800 Å thick, antireflection coating layer 16b, here of zinc sulfide (ZnS), 10,000 Å thick. Layers 16a, 16b are used to protect the channel region 15 and to provide a composite layer window 16 which is transparent to electromagnetic energy in the wavelength range of approximately 0.8 μm to 30 μm.

Incident electromagnetic radiation 17 in the range of 0.8 μm to 30 μm is directed towards the window 16. In response to such incident radiation 17, the conductivity of the epitaxial layer 12b changes, thus permitting photoconductive element 10 to detect the presence of the incident electromagnetic radiation 17. Further, the ratio x of Cd to Te may be adjusted, as is known, to cover different ranges of wavelengths within the band of approximately 0.8 μm to 30 μm.

Figure 3B:
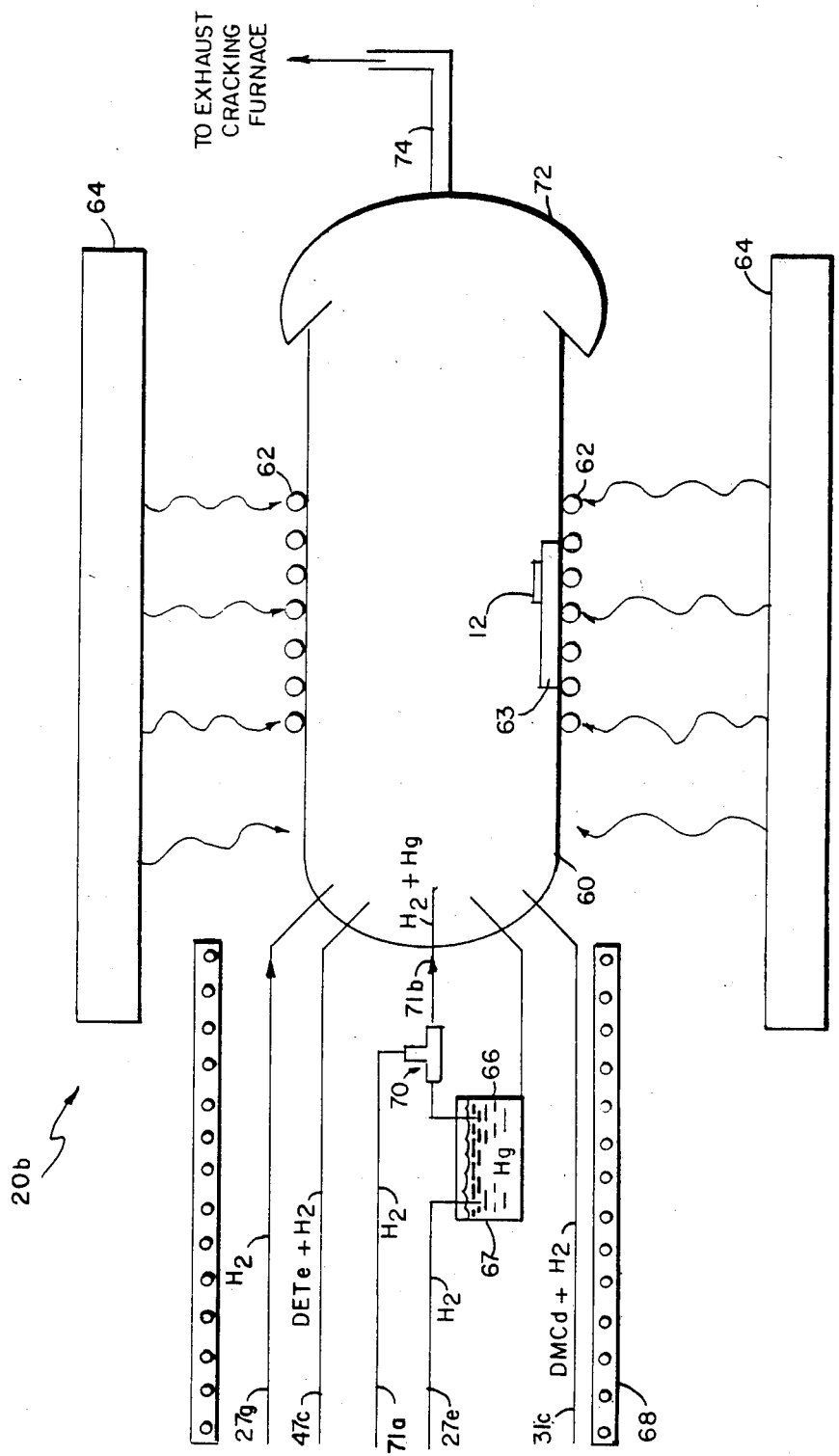

Referring now to FIGS. 3, 3A and 3B, a schematic representation of a vapor phase epitaxial apparatus 20 (FIG. 3) used for growing the epitaxial layers 12a, 12b of cadmium telluride or mercury cadmium telluride, as described in conjunction with FIG. 1 above, includes a vapor apparatus 20a (FIG. 3A) having a manifold 26 with mass flow controllers 26a–26f, and bubbler apparatus 39 and 55, as shown. Hydrogen is fed via $H_2$ purifier and valve 24 to manifold 26. Helium is fed through apparatus 20 when such is exposed to air. The vapor phase apparatus 20 also includes a vapor phase epitaxial reactor 20b (FIG. 3A), here including an open quartz reaction tube 60, as shown. Suffice it to say here that a graphite susceptor 63 is disposed in the quartz reaction tube 60 and the susceptor is inductively heated by an RF coil 62. RF coil 62 is disposed around the periphery of quartz reactor tube 60 and is then activated such that the susceptor 63 is heated to a predetermined temperature. The temperature to the susceptor 63 is monitored via a thermocouple (not shown) embedded in the susceptor 63. Prior to the susceptor 67 and the substrate 12 being heated, however, the system is purged of atmospheric gases by introducing helium, then hydrogen into the interior of the furnace tube 60 and the vapor apparatus 20a. Then, vapors from lines 27e–27g, 31c and 47c are fed into the tube where they react to provide the epitaxial layers 12a, 12b. Quartz reaction tube 60 also includes a cap 72 at an opposite end from lines 27e–27g, 31c and 47c. Cap 72 is coupled to a quartz exhaust line 74 which is used to exhaust gases from tube 60 and deliver such gases to a cracking furnace (not shown).

Referring now particularly to FIG. 3A, the vapor apparatus 21a provides tubes 31c, 47c and 27e–27g which feed said vapors to the quartz reaction tube 60.

Tube 31c, the dimethylcadmium+$H_2$ (DMCd+$H_2$) tube is fed from a junction member 32. Junction member 32 is used to mix flows from two gas sources delivered to a pair of ports thereof, and direct said mixed gas flow to a third port thereof which is coupled to a quartz tube 31c. The first port of junction 32 is fed from the bubbler apparatus 39. Bubbler apparatus 39 includes a pair of solenoid control valves 28, 30. A first one of said solenoid control valves, here solenoid control valve 28, has a first port coupled to a first mass flow controller 26a via tube 27a, and has a second port coupled to a bubbler 36 via tube 29a. Bubbler 36 here has disposed therein the dimethylcadmium (DMCd) 37. The bubbler 36 is provided in a recirculating temperature control bath 40 which provides a constant flow of a coolant liquid around the bubbler 36 to maintain the dimethylcadmium 37 contained in bubbler 36 at a predetermined temperature of here 18.5° C. A second tube 29c is disposed in bubbler 36, but above the surface of the dimethylcadmium liquid and is coupled to a port of solenoid control valve 30. A third tube 29b is coupled between remaining ports of solenoid control valves 28 and 30. The normally deactivated state of solenoid control valves 28 and 30 enables hydrogen gas to pass from the hydrogen source, here the mass flow controller 26a via tube 27a to tube 29b, and hence to tube 31c to purge the reactor vessel of atmosphere gases as described above. During epitaxial growth of cadmium telluride or mercury cadmium telluride on the substrate 12, valves 28 and 30 are placed in their activated state enabling hydrogen gas to pass through tube 29a into bubbler 36 which contains the dimethylcadmium liquid 37a. The hydrogen gas bubbles through the dimethylcadmium liquid 37 and picks up molecules of dimethylcadmium 37. Therefore, a mixture of dimethylcadmium and hydrogen (DMCd+$H_2$) emerges from bubbler 36 via line 29c and is routed by solenoid control valve 30 to line 31a. A second mass flow controller 26b is activated to provide a predetermined flow of carrier gas, here hydrogen, through a valve 34 and via line 31b to junction member 32. Therefore, emerging from line 31c is a diluted vapor flow of dimethylcadmium and the carrier gas, here hydrogen.

Tube 47c, the diethyltelluride+H$_2$ (DETe+H$_2$) tube is fed from a junction member 48. Junction member 48 is used to mix flows from two gas sources and deliver said mixed gas flow to a third port coupled to tube 47c. The first port of junction 48 is fed from the bubbler apparatus 55. Bubbler apparatus 55 includes a pair of solenoid control valves 44, 46. A first one of said solenoid control valves, here solenoid control valve 44, has a first port coupled to a third mass flow controller 26c via tube 27c, and has a second port coupled to a bubbler 52 via tube 45a. Bubbler 52 here has disposed therein diethyltelluride 53. The bubbler 52 is provided in a recirculating temperature control bath 56 which provides a constant flow of a coolant liquid around the bubbler 52 to maintain the diethyltelluride liquid 53 of bubbler 52 at a predetermined temperature of here 30° C. A second tube 45c is disposed in bubbler 52, but above the surface of the diethyltelluride liquid and is coupled to a port of solenoid control valve 46. A third tube 45b is coupled between remaining ports of solenoid control valves 44 and 46. The normally deactivated state of solenoid control valves 44 and 46 enables hydrogen gas to pass from the hydrogen source, here the mass flow controller 26c via tube 27c to tube 45b, and hence to tube 47c to purge the reactor vessel of atmosphere ases as described above. During epitaxial growth of cadmium telluride or mercury cadmium telluride on the substrate 12, valves 44 and 46 are placed in their activated state enabling hydrogen gas to pass through tube 45a into bubbler 52 which contains the diethyltelluride liquid 53. The hydrogen gas bubbles through the diethyltelluride liquid 53 and picks up molecules of diethyltelluride 53. Therefore, a mixture of diethyltelluride and hydrogen (DETe+H$_2$) emerges from bubbler 53 via line 45c and is routed by solenoid control valve 46 to line 47a. A fourth mass flow controller 26d is activated to provide a predetermined flow of carrier gas, here hydrogen, through a valve 50 and via line 47b to junction member 48. Therefore, emerging from line 47c is a diluted vapor flow of diethyltelluride with respect to the concentration of the carrier gas, here hydrogen.

Tube 26e the mercury+H$_2$ (Hg+H$_2$) tube, is fed from a fifth mass flow controller 26e via line 27e to a quartz reservoir 66 containing mercury. The hydrogen gas is directed over the surface of the liquid mercury. Vapor molecules over the liquid mercury are picked up by the hydrogen gas flow and a vapor flow of mercury and hydrogen is fed to a quartz junction element 70. A second input port of quartz junction element 70 is fed via a quartz tube 71a which is coupled to a sixth mass flow controller 26f via a valve 72 and tube 27f. Emerging from junction element 70 via tube 71b and into tube 60 is, therefore, a diluted flow of mercury vapor and hydrogen.

As previously mentioned, the susceptor 63 is heated by an r.f. coil disposed around the quartz reaction tube 60.

A quartz reservoir 66 containing the liquid elemental mercury and the region adjacent thereof is resistively heated by a resistance heat source 68, as shown, to a temperature of at least 240° C. The zone immediately after the reservoir 66 and past the substrate 12 is then heated by banks of infrared lamps 64 to a temperature of at least 240° C. With this arrangement, the resistive heat source 68 for the reservoir 66, and the infrared lamp banks 64 warm the reservoir and walls of the reactor tube 60 to a temperature of at least 240° C. This arrangement prevents the premature condensation of mercury from the vapor streams and thus this problem encountered in growing HgCdTe. Further, by placing the bank of infrared lamps outside of the region of the r.f. coils, there is no interference between the r.f. coils and lamps which could lead to inoperability of the various heating systems. Also, high quality epitaxial films are provided since the diluted flows of DETe, DMCd and Hg in the H$_2$ carrier gas reduce premature reactions between mercury and diethyltelluride, and diethyltelluride and dimethylcadmium.

The outwardly exposed surface of the substrate 11 is cleaned and polished using a bromine methanol solution, degreased and chemically etched before growth of various the epitaxial layers. The substrate 11 is then placed on the susceptor 63 which is then disposed in the quartz reaction tube 60.

In operation, furnace tube 60 is purged of atmospheric gases by introduction of hydrogen gas as described above. The susceptor 63 is then inductively heated by the r.f. coil 62, the reservoir 66 by the resistive heating element 68, and reaction tube 60 by the infrared lamps 64. Each is then allowed to reach the growth temperatures. When the apparatus 20 has reached the growth temperatures, valves 28, 30, 34, 44, 46, 50 and 72 are activated enabling diluted mixtures of hydrogen gas and dimethylcadmium, hydrogen gas and diethyltelluride, and hydrogen gas and mercury to emerge from tubes 31c and 47c and 71b, respectively, upstream from the substrate 12. The hydrogen and metalorganic vapors are at the desired operating temperature provided by the uniform heating of the substrate. The metalorganics will decompose into gaseous hydrocarbons and elemental cadmium, and tellurium in accordance with the following chemical reactions:

$$(CH_3)_2Cd \rightarrow (CH_3)_2Cd + Cd + hydrocarbons$$

$$(C_2H_5)_2Te \rightarrow (C_2H_5)_2Te + Te + hydrocarbons$$

The elemental mercury, cadmium and telluride will then react to form:

$$(1-x)Hg + (x)Cd + Te \rightarrow Hg_{1-x}Cd_xTe$$

The composition x is controlled by regulating the flow of H$_2$ into the Hg reservoir, the temperature of the Hg reservoir and the concentration of DMCd and DETe.

The mole fraction (i.e., concentration of DMCd, DETe and Hg) is given by:

$$MF(DMCd) = \frac{H_2 \text{ through bubbler } 36}{\text{Total } H_2 \text{ Flow in Tube } 60} \times$$

$$\frac{DMCd \text{ Vapor Pressure TORR}}{760 \text{ TORR}}$$

$$MF(DETe) = \frac{H_2 \text{ through bubbler } 52}{\text{Total } H_2 \text{ Flow in Tube } 60} \times$$

$$\frac{DETe \text{ Vapor Pressure TORR}}{760 \text{ TORR}}$$

$$MF(Hg) = \frac{H_2 \text{ over reservoir } 66}{\text{Total } H_2 \text{ Flow in Tube } 60} \times$$

| Hg Vapor Pressure TORR |
|---|
| 760 TORR |

Only a portion of the metalorganic vapors which are directed over the substrate 12 is actually reacted. Therefore, unreacted metalorganic vapors are exhausted from the reactor tube 60 via the exhaust line 74 and are directed towards an exhaust cracking furnace (not shown) which operates at a temperature in the range of 800° C. to 900° C. This furnace is used to crack any of the remaining metalorganic gases into the metals and used to combust the organic vapors providing a gas stream which consists substantially only of hydrogen. The hydrogen in this gas stream is then vented.

The above-described apparatus has been used to grow device quality cadmium telluride and mercury cadmium telluride epitaxial films. Cadmium telluride epitaxial film growth was developed for applications as for detecting energy at about 0.8 μm and for providing buffer layer 12a between the substrate 11 and active mercury cadmium telluride layer 12b, as described in conjunction with FIG. 1. The preferred growth conditions used for growing a cadmium telluride epitaxial layer 12a are:

Substrate CdTe (111) A orientation
Substrate temperature = 400° C.
Total hydrogen flow = 2 to 2.5 l/min for a 50 mm diameter quartz tube
Dimethylcadmium mole fraction = $8 \times 10^{-4}$
Diethyltelluride mole fraction = $4 \times 10^{-3}$
Growth rate = 10μ/hour The CdTe epitaxial layer 12a is specular, that is, the layer has a finish which is substantially smooth and mirrorlike. The layer has good electrical properties as a buffer layer with a relatively high resistivity and a free carrier concentration of less than $10^{15}$ cm$^{-3}$.

N-type mercury cadmium telluride layer 12b is grown on top of the cadmium telluride buffer layer 12a. The mercury cadmium telluride layer 12 growth is performed sequentially after the cadmium telluride layer growth without interruption of the growth process. A preferred range of growth conditions are:

| | |
|---|---|
| Dimethylcadmium mole fraction | $3.0 \times 10^{-4}$ to $4.5 \times 10^{-4}$ |
| Diethyltelluride mole fraction | $2.9 \times 10^{-3}$ to $3.5 \times 10^{-3}$ |
| Mercury mole fraction | $2.6 \times 10^{-2}$ to $3.2 \times 10^{-2}$ |

The preferred growth conditions for the mercury cadmium telluride are:

Substrate CdTe (111) A orientation
Buffer layer 12a as described above
Substrate temperature = 400° C.
Total hydrogen flow = 1.8 l/min for a 50 mm diameter quartz tube
Dimethylcadmium mole fraction = $3 \times 10^{-4}$
Diethyltelluride mole fraction = $3 \times 10^{-3}$
Mercury mole fraction = $3 \times 10^{-2}$
Growth rate = 3μ/hour
Composition x ≃ 0.2

The mercury cadmium telluride layer 12b is also specular and single crystalline with high crystalline perfection.

The electrical properties obtained from the mercury cadmium telluride films for x ≃ 0.2 are shown in Table I.

P-type material suitable for use as a photovoltaic element (not shown) was also grown. The preferred growth condition ranges of such material were:

| | |
|---|---|
| Dimethylcadmium mole fraction | $3.0 \times 10^{-4}$ to $4.5 \times 10^{-4}$ |
| Diethyltelluride mole fraction | $1.9 \times 10^{-3}$ to $2.3 \times 10^{-3}$ |
| Mercury mole fraction | $2.6 \times 10^{-2}$ to $3.2 \times 10^{-2}$ |

The preferred growth conditions for P-type mercury cadmium telluride layers are:

Substrate CdTe (111) A orientation
Buffer layer 12a as described above
Substrate temperature = 400° C.
Total hydrogen flow = 1.8 l/min for a 50 mm diameter quartz tube
Dimethylcadmium mole fraction = $3 \times 10^{-4}$
Diethyltelluride mole fraction = $2.1 \times 10^{-3}$ p1 Mercury mole fraction = $3 \times 10^{-2}$
Growth rate = 3μ/hour
Composition x ≃ 0.3

The P-type mercury cadmium telluride layer (not shown) is also specular and single crystalline with high crystalline perfection. The electrical properties for such material are shown in Table II.

P-type material is obtained by changing the composition x to be approximately 0.3. Epitaxial layers of this composition have a sufficient number of mercury vacancies in the crystal which provide acceptor carriers or P-type carriers thereby making the material P-type.

TABLE I

| No. | $Hg_{1-x}Cd_xTe$ Composition x | HgCdTe Film Thickness (Microns) | $N_D-N_A$ at 300° K. | $N_D-N_A$ at 77° K. | Mobility at 300° K. | Mobility at 77° K. |
|---|---|---|---|---|---|---|
| 1 | 0.17 | 9.0 | $6.9 \times 10^{16}$ | $3.54 \times 10^{15}$ | 23,300 | 587,000 |
| 2 | 0.19 | 9.6 | $3.4 \times 10^{16}$ | $1.52 \times 10^{15}$ | 16,600 | 171,000 |
| 3 | 0.19 | 7.4 | $4.6 \times 10^{16}$ | $1.91 \times 10^{15}$ | 18,800 | 278,000 |
| 4 | 0.20 | 10.0 | $4.5 \times 10^{16}$ | $1.53 \times 10^{15}$ | 15,100 | 293,000 |
| 5 | 0.19 | 8.5 | $5.5 \times 10^{16}$ | $2.53 \times 10^{15}$ | 16,900 | 281,000 |
| 6 | 0.18 | 9.1 | $1.1 \times 10^{17}$ | $1.1 \times 10^{16}$ | 23,300 | 363,000 |

TABLE II

| No. | Thickness | x $Hg_{1-x}Cd_xTe$ Composition | $N_D-N_A$ at 300° K. | $N_D-N_A$ at 77° K. | Mobility at 300° K. | Mobility at 77° K. |
|---|---|---|---|---|---|---|
| 10 | 9.1 | 0.27 | $1.3 \times 10^{16}$ | $4.7 \times 10^{15}$ | 4420 | 189 |
| 11 | 6.0 | 0.38 | $9.3 \times 10^{14}$ | $2.2 \times 10^{15}$ | 980 | 139 |
| 12 | 5.3 | 0.30 | $1.4 \times 10^{15}$ | $1.7 \times 10^{15}$ | 1140 | 90 |

TABLE II-continued

| No. | Thickness | x $Hg_{1-x}Cd_xTe$ Composition | $N_D-N_A$ at 300° K. | $N_D-N_A$ at 77° K. | Mobility at 300° K. | Mobility at 77° K. |
|---|---|---|---|---|---|---|
| 13 | 5.6 | 0.30 | $1.7 \times 10^{15}$ | $8.6 \times 10^{14}$ | 4460 | 219 |
| 14 | 7.9 | 0.28 | $1.2 \times 10^{16}$ | $8.4 \times 10^{15}$ | 7300 | 129 |

Having described a preferred embodiment of the invention, it will now be apparent to one of skill in the art that other embodiments incorporating its concept may be used. It is felt, therefore, that this embodiment should not be limited to the disclosed embodiment, but rather should be limited only by the spirit and scope of the appended claims.

What is claimed is:

1. A method for growing in a reactor vessel a Group II-VI epitaxial layer over a crystalline substrate comprising the steps of:

placing the substrate on a susceptor which is heated to a first predetermined temperature by directing r.f. energy through the susceptor;

directing a flow of a Group II metalorganic into the reactor vessel toward the substrate;

directing a flow of a Group VI metalorganic into the reactor vessel toward said substrate;

directing a flow of a carrier gas over a Group II metal provided in a separately heated reservoir disposed outside of the reactor vessel to provide a composite flow of the carrier gas and Group II metal;

directing the composite flow of the carrier gas and Group II metal into the reactor vessel toward the substrate;

directing radiation towards the reactor vessel to warm the source of Group II metal and the zone of the reactor vessel between the Group II metal source and the substrate; and chemically reacting the directed flows of Group II metalorganic, Group VI metalorganic and Group II metal to form the epitaxial layer over the substrate.

2. The method as recited in claim 1 wherein the r.f. energy is provided from an r.f. coil disposed around the reaction vessel and the radiation is infrared radiation provided by a plurality of infrared lamps disposed outside of the region occupied by the r.f. coil.

3. The method as recited in claim 2 wherein the mole fraction ratio of the Group VI metalorganic to Group II metalorganic is at least 5 to 1.

4. The method as recited in claim 3 wherein the source of the Group II metal and the region between the source of Group II metal and the susceptor are heated to a temperature of at least 240° C.

5. The method as recited in claim 1 wherein each one of said directed metalorganic flows further comprises a first flow of a carrier gas, and wherein each directing step further comprises the step of:

adding to said directed flow a second flow of a carrier gas to provide a total flow of said carrier gas in the reactor vessel equivalent to a flow through a reactor vessel having a diameter of 50 mm of at least 1.8 liters/min. for a mole fraction of the Group II metalorganic in the range of $3.0 \times 10^{-4}$ to $4.5 \times 10^{-4}$, a mole fraction of the Group VI metalorganic in the range of $2.9 \times 10^{-3}$ to $3.5 \times 10^{-3}$, and a mole fraction of the Group II metal in the range of $2.6 \times 10^{-2}$ to $3.2 \times 10^{-2}$.

6. The method as recited in claim 5 wherein the Group II metalorganic vapor comprises dimethylcadmium and hydrogen, the Group II metalorganic vapor comprises diethyltelluride and hydrogen, and the Group II metal vapor comprises mercury and hydrogen.

* * * * *